United States Patent [19]

Walz

[11] Patent Number: 5,308,250

[45] Date of Patent: May 3, 1994

[54] PRESSURE CONTACT FOR CONNECTING A COAXIAL SHIELD TO A MICROSTRIP GROUND PLANE

[75] Inventor: Dale D. Walz, Colorado Springs, Colo.

[73] Assignee: Hewlett-Packard Company, Palo Alto, Calif.

[21] Appl. No.: 968,908

[22] Filed: Oct. 30, 1992

[51] Int. Cl.$^5$ .............................................. G01R 1/06
[52] U.S. Cl. ................... 439/63; 324/158 P
[58] Field of Search ............... 439/63, 581, 482; 324/72.5, 158 F, 158 P

[56] References Cited

U.S. PATENT DOCUMENTS

| | | | |
|---|---|---|---|
| 4,588,241 | 5/1986 | Ardezzone | 439/581 |
| 4,739,259 | 4/1988 | Hadwin et al. | 324/72.5 |
| 4,740,746 | 4/1988 | Pollock et al. | 324/72.5 |
| 5,004,977 | 4/1991 | Kazama | 324/158 P |
| 5,068,602 | 11/1991 | Mielke | 324/158 P |
| 5,199,887 | 4/1993 | Iacono | 439/581 |

*Primary Examiner*—Neil Abrams
*Attorney, Agent, or Firm*—Augustus W. Winfield

[57] ABSTRACT

A probe fixture for making multiple high frequency connections to an electronic device under test. An application for the apparatus is in integrated circuit wafer testing fixtures requiring high frequency signals. Low frequency signals are attached by ribbon cables to a printed circuit board. High frequency signals use coaxial cables. A probe carrying ceramic substrate has microstrips for the high frequency signals. Low frequency signals are connected from the printed circuit board to the ceramic substrate by a conductive elastomer interconnect strip clamped between the printed circuit board and the substrate. Coaxial adapters passing through the printed circuit board have spring loaded center conductors to provide pressure contact between the coaxial cables and microstrip signal strips. In one embodiment, contact between coaxial cable shields and microstrip ground is through a conductive clamp to a substrate backplane. In an alternative embodiment, contact between a coaxial cable shield and the microstrip ground is provided by a flat spring connected to a barrel on the coaxial adapter connector body and in pressure contact with coplanar ground contacts on the substrate. In the alternative embodiment, a short ground path from the cable shield to the microstrip ground minimizes transmission line impedance discontinuity.

7 Claims, 12 Drawing Sheets

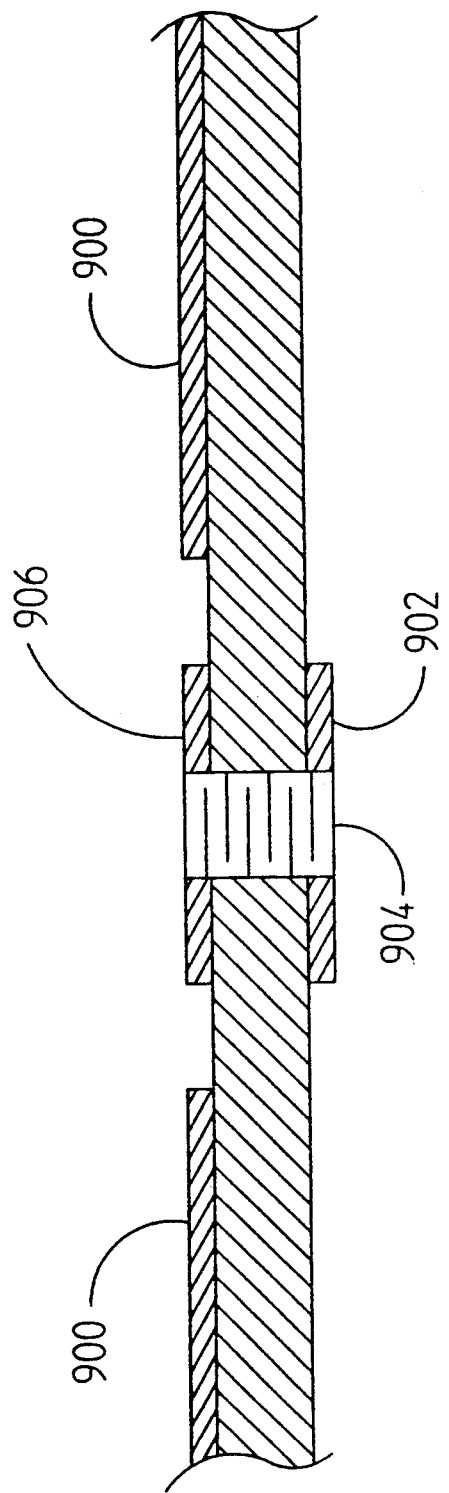

PRESSURE CONTACT FOR CONNECTING A COAXIAL SHIELD TO A MICROSTRIP GROUND PLANE

CROSS REFERENCE TO RELATED APPLICATION

Application Ser. No. 07/968,695, filed Oct. 30, 1992, entitled Probe Fixture for Integrated Circuit Wafer Testing, by Daniel T. Hamling.

1. Field of Invention

This invention relates to high frequency electronic connectors and more particularly to connectors for adapting a coaxial cable to a high frequency microstrip or other non-coaxial transmission lines.

2. Background of the Invention

Many electronic testing applications require a fixture capable of providing multiple simultaneous connections for stimulus signals to a device under test and for connection of response signals to test instruments. Examples include integrated circuit wafer testing, hybrid testing, multichip module testing and printed circuit board testing. In particular, a wafer probe fixture needs interface circuitry close to the probes and perhaps hundreds of signal connections, all in a very confined space. As circuits increase in speed and complexity, the ability to test such circuits at operating speed becomes more difficult. Conventional needle probe wafer fixtures typically cannot be used for frequencies greater than 100 MHz. Probes designed for microwave frequencies (up to 50 GHz) are typically suitable only for low pad count devices. There is a need for probe fixtures providing hundreds of probes with a simultaneous mix of low frequency signals and high frequency signals with bandwidths up to a few Gigahertz.

For high frequencies (>100 MHz), the device under test or the fixture may incorporate transmission lines to minimize signal distortion and attenuation. A common non-coaxial transmission line for short distances within circuit modules is a microstrip. This is a strip conductor and an extended parallel conducting surface separated by a dielectric substrate. Alternative non-coaxial transmission lines include configurations in which a strip conductor is coplanar with extended parallel conducting surfaces (separated by air) and configurations in which a strip conductor is buried within a dielectric substrate having extended parallel conducting surfaces above and below the strip conductor (stripline).

For transmission over longer distances, a coaxial cable may be used. Connection between a coaxial cable and a microstrip is typically made by wire bonding a coaxial connector to pads on a substrate or by soldering a coaxial connector onto the edge of a substrate. Wire bonded or soldered connectors are not easily removable and removal may be destructive. Because of space constraints, edge mounted connectors may limit the number of high frequency connections which can be made. In addition, edge mounted connectors may require undesirable long signal paths. There is a need for temporary connections or easily removable connections for high frequency signals which do not require wire bonding or soldering to a microstrip. In addition, there is a need for high frequency signal connections to the interior of a substrate rather than just the edge. In particular, in integrated circuit wafer testing, there is a need for test fixtures providing numerous temporary connections for low frequency signals and simultaneously providing numerous temporary connections between external coax cables and microstrips which are within the test fixture.

A transition from microstrip to coax creates an unavoidable discontinuity in transmission line impedance which in turn causes signal distortion due to reflections. There is a need for a temporary or easily removable connection having a connection geometry which minimizes reflections. In particular, there is a need for a short path between the microstrip ground plane and the shield on the coax.

SUMMARY OF THE INVENTION

The present invention provides a temporary or easily removable ground contact for a connection between a coaxial connector and a microstrip. The present invention provides a short ground path from cable shield to microstrip ground which minimizes transmission line impedance discontinuity. Non-coaxial transmission lines such as microstrips are adapted to provide coplanar contacts for both signal and ground. Contact between the coplanar microstrip ground contact and the coaxial cable shield is provided by a flat spring tab connected to the barrel of a coaxial adapter connector.

BRIEF DESCRIPTION OF THE DRAWINGS

FIGS. 9A and 9B illustrate alternative non-coaxial transmission line configurations.

DETAILED DESCRIPTION OF THE PREFERRED EMBODIMENT OF THE INVENTION

Figure 1:
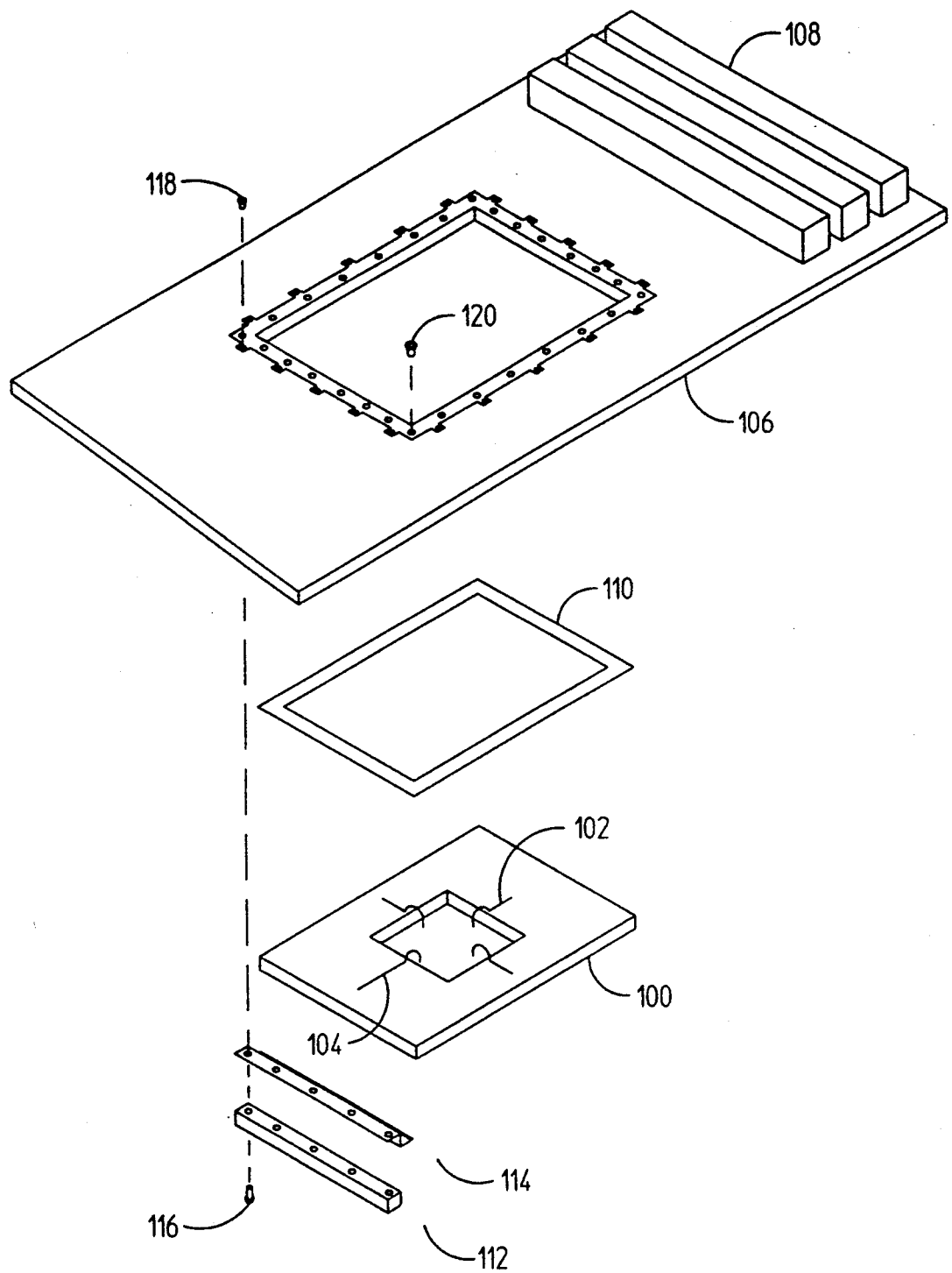
FIG. 1 is a perspective view of the test fixture encompassing the present invention.

FIG. 1 illustrates an integrated circuit wafer probe test fixture to illustrate an embodiment of the present invention. The test fixture has a thick film ceramic substrate 100 with miniature probes 102 for probing bonding pads on an integrated circuit on a wafer (not illustrated). The ceramic substrate 100 can support a maximum of 144 probes in the embodiment illustrated. In addition, custom thickfilm circuitry (not illustrated) such as trimmed resistors and bypass capacitors are provided close to the device under test. A printed circuit board 106 has ribbon cable connectors 108 for power supply and low frequency stimulus and response signals. Elastomer interconnect strip 110 connects traces on the bottom of the printed circuit board 106 to traces on the top of the ceramic substrate 100. The elastomer interconnect strip 110 is clamped between the ceramic substrate 100 and the printed circuit board 106 by a stiffener bar 112 (one of four), clamp 114 (one of four), screw 116 (one of 20) and a small threaded insert 118 (one of 20).

The elastomer interconnect strip 110 is commercially available material which provides electrical conduction in a direction perpendicular to the plane of the strip but not along the plane of the strip. For example, the strip may be constructed of silicone rubber with short embedded wires in the vertical direction. A suitable material is "type GD inter-connector" available commercially from Shin-Etsu Polymer America, Inc., 34135 7th Street, Union City, Calif. 94587.

FIG. 1 also illustrates a larger threaded insert 120 (one of 28) which can accept the threaded body of a coaxial adapter (not illustrated in FIG. 1). Coaxial adapters are used for high frequency signals which need to make contact to microstrips on the ceramic substrate 100.

In the test fixture illustrated in FIG. 1, the ceramic substrate 100 is uniquely matched to a specific integrated circuit with a specific mix of low and high frequency signals and a specific pattern of bonding pads. The printed circuit board 106 is designed to be generic for all integrated circuits but can be customized for special requirements.

Figure 2:
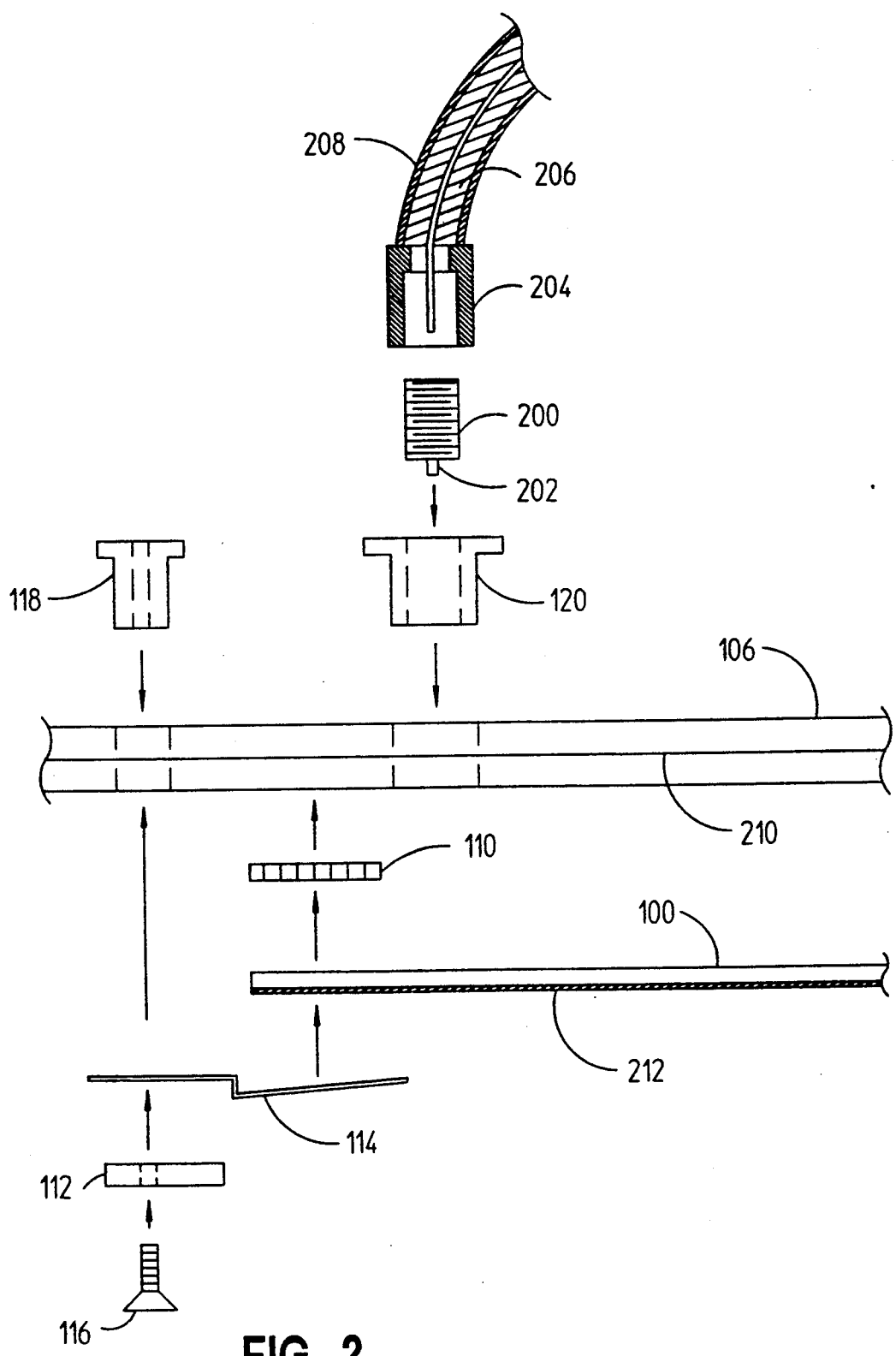
FIG. 2 is a cross section of a portion of the test fixture of FIG. 1.

FIG. 2 illustrates a cross section of a portion of the fixture of FIG. 1. In FIG. 2 as in FIG. 1, an elastomer interconnect strip 110 connects traces on the bottom of the printed circuit board 106 to traces on the top of the ceramic substrate 100. The elastomer interconnect strip 110 is clamped between the ceramic substrate 100 and the printed circuit board 106 by a stiffener bar 112 (one of four), clamp 114 (one of four), screw 116 (one of 20) and a small threaded insert 118 (one of 20). A larger threaded insert 120 (one of 28) accepts the threaded body of a coaxial adapter 200 (one of 28). Adapter 200 has a spring-loaded center conductor pin 202 which makes contact with a high frequency microstrip signal trace on the top surface of ceramic substrate 100. Also illustrated in FIG. 2 is a coaxial cable connector 204 attached to a coaxial cable 206. In a specific wafer test fixture application, the coaxial cable connector 204 is a sub-miniature series A (SMA) male connector.

Figure 3:
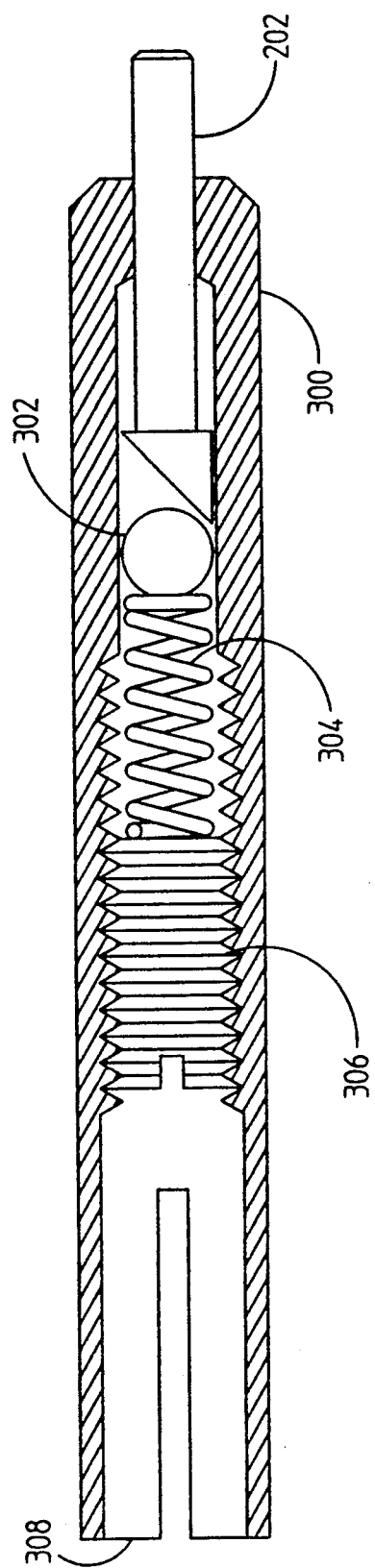
FIG. 3 is a detailed cross section of a spring loaded center conductor for a coaxial adapter illustrated in FIG. 2.

FIG. 3 illustrates a cross section of the spring loaded center pin 202 illustrated in FIG. 2. A metal body 300 supports the center pin 202 which contacts a conductive ball 302, a spring 304 and a set screw 306. A slit 308 through one end of the body 300 provides a flexible (expandable) contact for the center pin of a mating coaxial connector such as connector 204 in FIG. 2.

Figure 4:
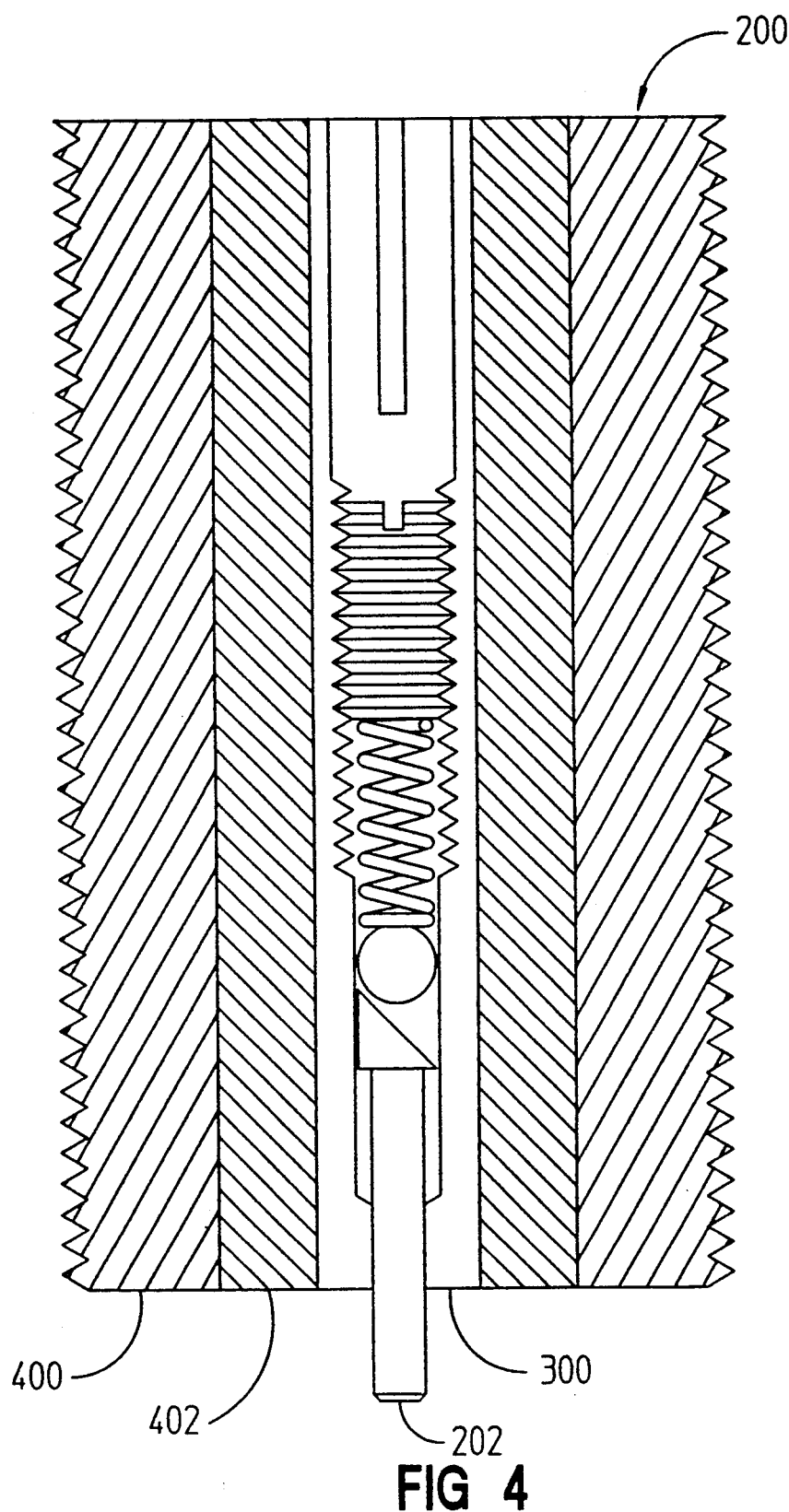
FIG. 4 is a cross section of the coaxial adapter illustrated in FIG. 2 including the spring loaded center conductor illustrated in FIG. 3.

FIG. 4 illustrates the assembled coaxial adapter. The center pin body 300 is pressed into a teflon sleeve 402 and the assembled combination of center pin and sleeve is pressed into the body 400 of the adapter.

Returning to FIG. 2, the coaxial cable 206 has a shield 208 which connects to a threaded shell on the coaxial connector 204 which in turn is threaded onto adapter 200 and ultimately makes electrical contact with a ground conductor area 212 on the ceramic substrate 100. In the configuration illustrated in FIG. 2, the ground path for the body of adapter 200 is through the large threaded insert 120, through a ground plane 210 in the PC board to the small threaded insert 118, to the conductive (beryllium copper) clamp 114, to a conductive backplane 212 on the bottom of the ceramic substrate 100. This circuitous ground path limits the low distortion frequency range of the connection to about 3.2 GHz because of the discontinuity in transmission line impedance.

Figure 5:
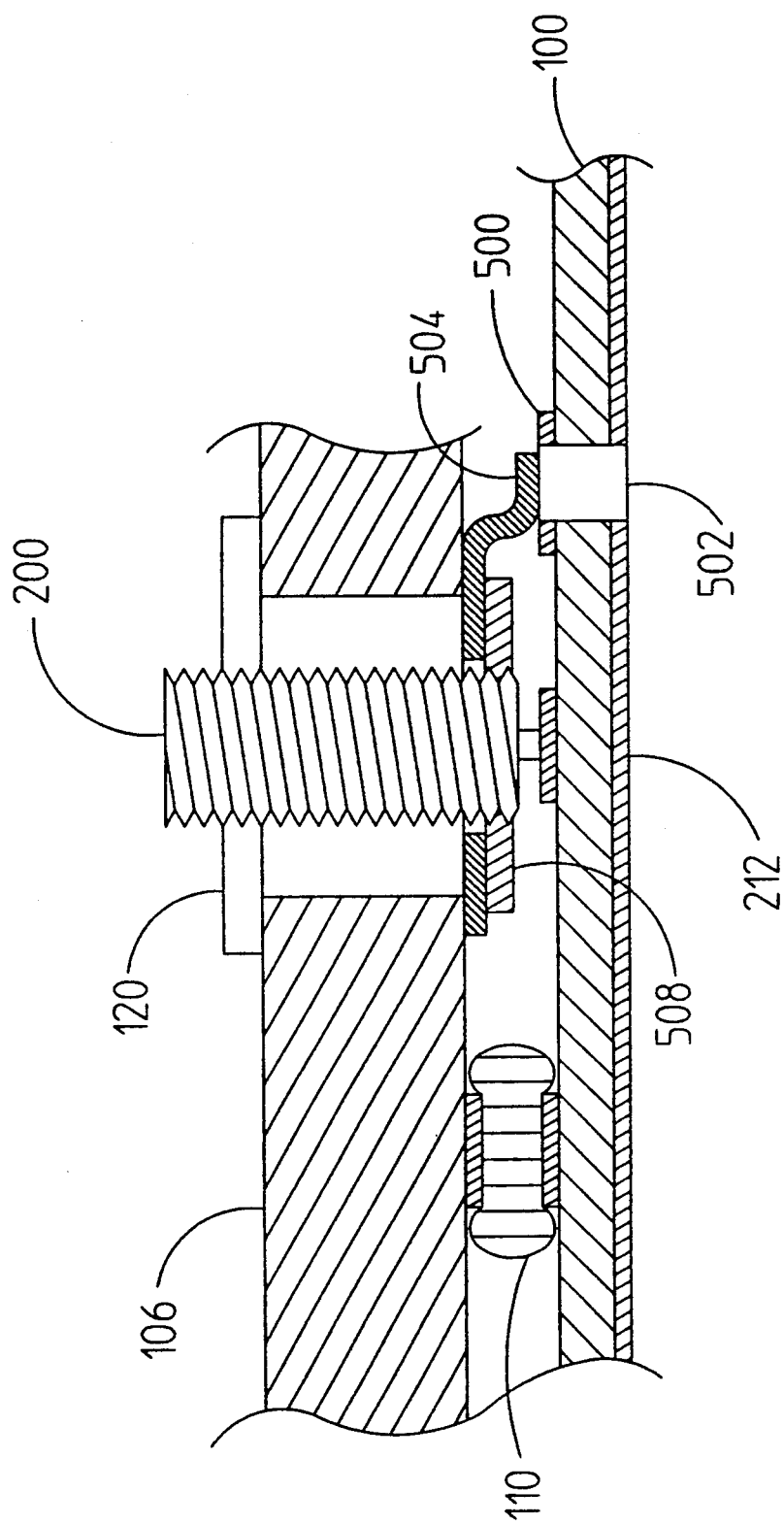
FIG. 5 is a cross section of a portion of a text fixture illustrating an alternative grounding apparatus for the coaxial adapter illustrated in FIG. 2.

FIG. 5 illustrates an apparatus providing an improved ground path. In FIG. 5, a ground pad 500 (one of 28) is provided on the top surface of ceramic substrate 100 by a plated through hole 502 (one of 56 or more) connecting to a back side ground plane 212. A grounding spring 504 (one of 28) is clamped between the bottom surface of the printed circuit board 106 and a threaded nut 508. The grounding spring 504 connects the barrel of the adapter 200 to the ground pad 500. As illustrated in FIG. 5, the grounding spring does not depend on a ground plane in the printed circuit board 106 or traces on the printed circuit board 106. Therefore, with grounding springs, a circuit board is not necessary for coaxial connections. A panel for mechanical support is the only requirement.

The ceramic substrate 100 with plated through holes 502 as illustrated in FIG. 5 assumes that transmission lines on the ceramic substrate have a ground plane on the bottom side of the ceramic substrate. The holes may be plated or they may be filled solid with a good electrical conductor (for example gold with glass filler). In alternative embodiments, a waveguide may have a signal strip with coplanar ground strips (see FIG. 8C). In a coplanar waveguide configuration, the plated through holes are not needed.

Figure 6:
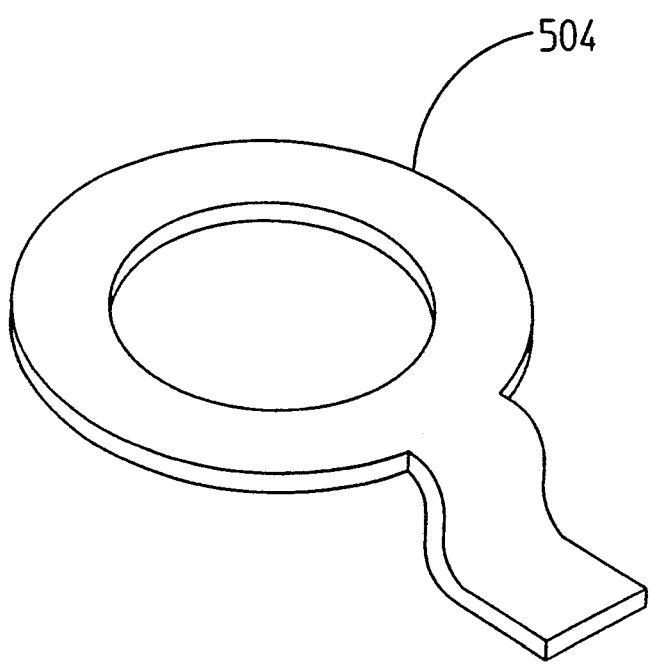
FIG. 6 is a perspective view of a grounding spring illustrated in FIG. 5.

FIG. 6 is a perspective view of the ground spring 504 illustrated in FIG. 5. The ground spring 504 may be any conductive material with sufficient elasticity to enable a pressure contact. For applications as illustrated in FIG. 1, beryllium copper is suitable.

Figure 7:
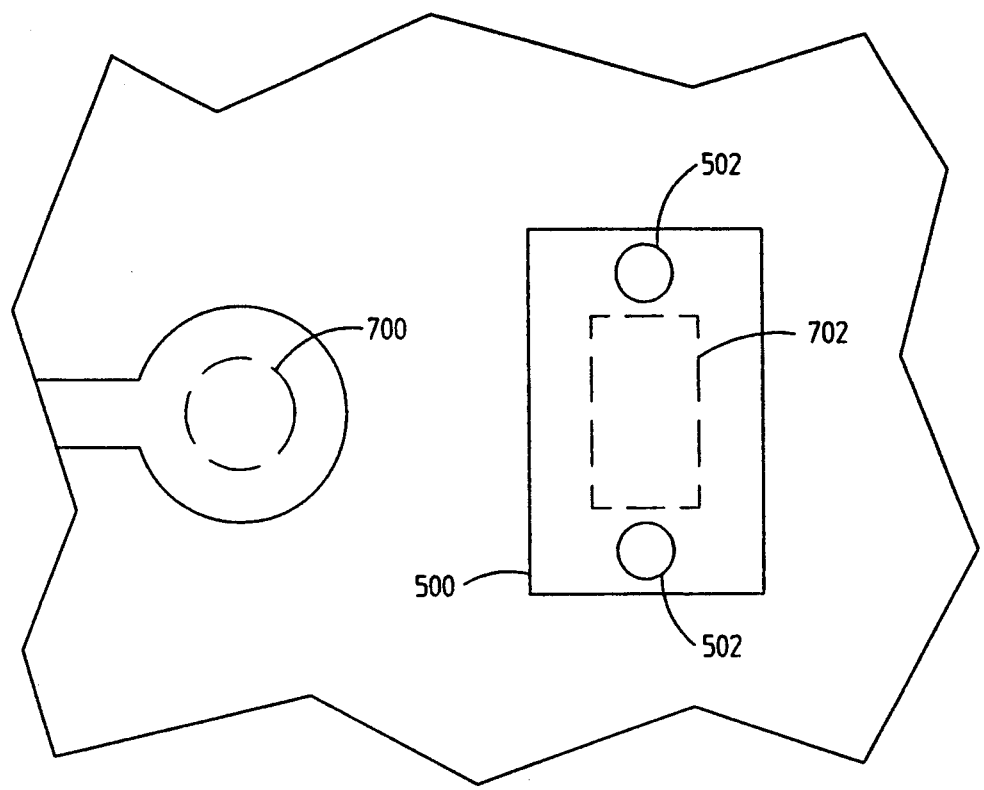
FIG. 7 is a top view of a substrate illustrating traces for use with the coaxial adapter of FIG. 2 and the grounding spring of FIG. 6.

FIG. 7 is a top view of a substrate illustrating traces for use with the grounding apparatus of FIG. 5. There is a contact area 700 for the spring loaded center conductor of the coaxial adapter. There is an additional larger contact area 702 for the ground spring. There are multiple plated through holes 502 near the ground spring contact area 702 for a low impedance path to a backplane on the back of the ceramic substrate.

Figure 8A:
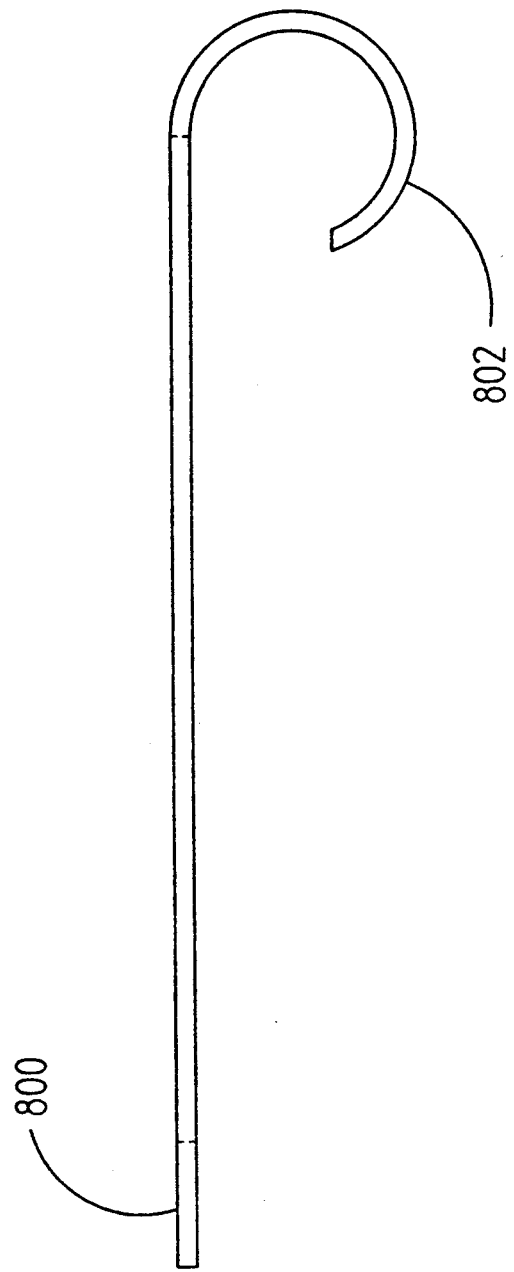
FIGS. 8A, 8B and 8C illustrate alternative configurations of the grounding spring.
Figure 8B:
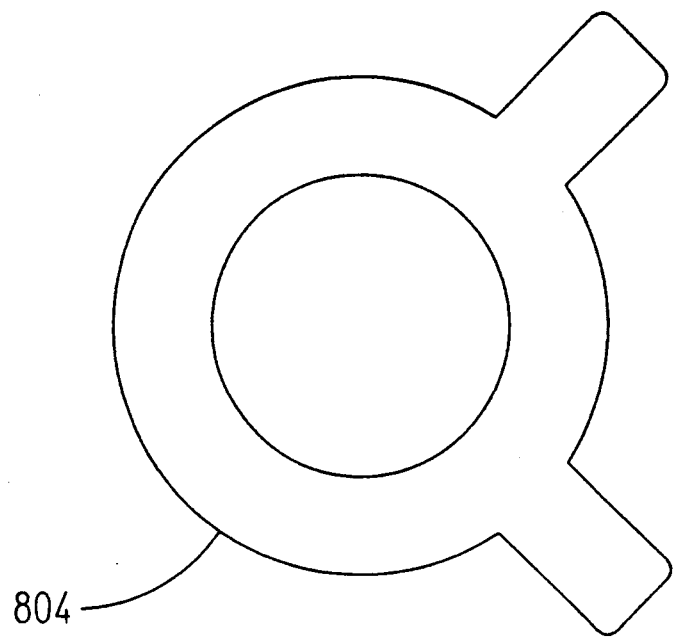
Figure 8C:
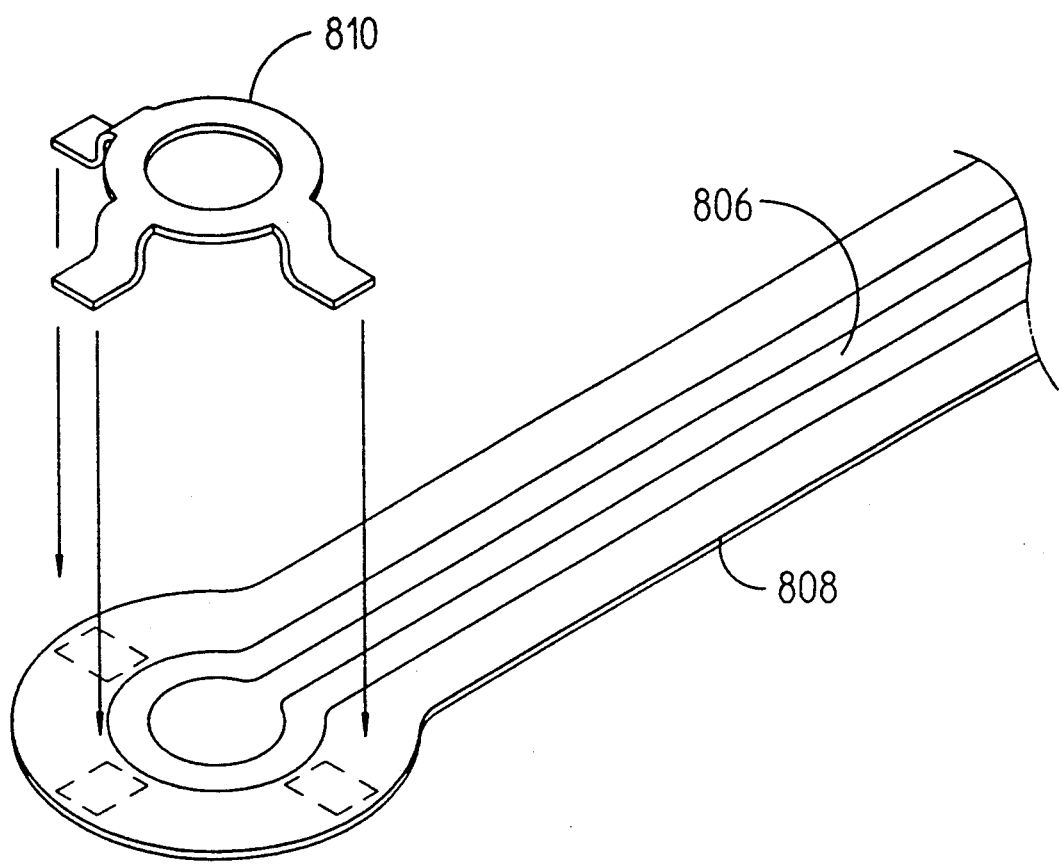

FIG. 6 illustrates a ground spring with a single outward tab. FIG. 8A illustrates one alternative shape. The spring 800 in FIG. 8A has a contact tab 802 curling under the body of the coaxial adapter so that the ground contact is directly in line with the shield. In addition, multiple tabs may be used as illustrated by ground spring 804 in FIG. 8B. Multiple tabs are particularly appropriate for a coplanar waveguide as illustrated in FIG. 8C. In FIG. 8C, a signal strip 806 is surrounded by a coplanar ground area 808. A three tabbed grounding spring 810 contacts the ground area 808 in three places.

Figure 9B:
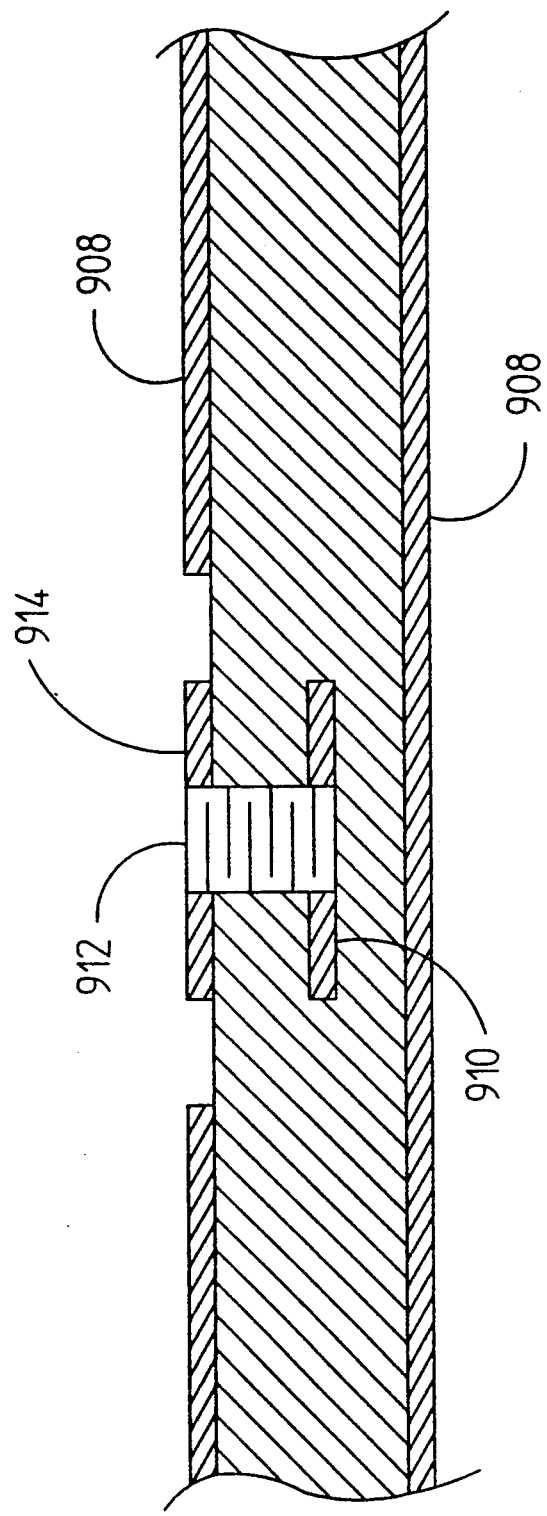

FIGS. 9A and 9B illustrate application of the present invention in alternative configurations for non-coaxial transmission lines. FIG. 9A illustrates a substrate in which the top side (connection side) is primarily ground plane 900 with a signal trace 902 on the bottom. In this configuration, the signal trace 902 is connected through the substrate by a plated through hole 904 to a conductive pad 906 for contact with the center conductor of the adapter connector (FIG. 2, 202). FIG. 9B illustrates a multilayer ceramic substrate in which both sides are primarily ground plane 908 and a signal trace 910 is buried within the ceramic. As in FIG. 9A, the signal trace 910 in FIG. 9B is connected through the substrate by a plated through hole 912 to a conductive pad 914 for contact with the center conductor of the adapter connector (FIG. 2, 202). For configurations as illustrated in FIGS. 9A and 9B, the ground spring configuration may have multiple tabs as illustrated by spring 810 in FIG. 8C.

The description above of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

I claim:

1. An apparatus for connecting a coaxial cable shield to a ground conductor on a dielectric substrate, the apparatus comprising:

adapter means for mechanically attaching a coaxial cable to a panel having a panel first side and a panel second side, the adapter means comprising a conductive adapter barrel and an adapter center conductor electrically isolated from the adapter barrel, wherein the adapter barrel passes through a hole in the panel, wherein the adapter barrel electrically connects to the coaxial cable shield and wherein the coaxial cable is mechanically attached to the adapter means on the panel first side;

a conductive ground spring having a planar portion with a ground spring hole and one or more spring tabs bent at an angle relative to the planar portion, wherein the adapter barrel passes through the ground spring hole;

mechanical fastener means for attaching the ground spring to the adapter barrel and the panel second side, wherein the mechanical fastener means attaches to the adapter barrel and presses the ground spring between the mechanical fastener means and the panel second side; and wherein the ground spring tabs are spring loaded against the ground conductor on the dielectric substrate.

2. An apparatus as in claim 1 wherein the dielectric substrate has a top surface and a bottom surface, wherein the ground conductor is attached to the top surface, the apparatus further comprising a microstrip as follows:

a strip signal conductor attached to the top surface;

a conductive ground backplane attached to the bottom surface; and a plurality of plated holes through the dielectric substrate, each plated hole electrically connecting the ground backplane to the ground conductor.

3. An apparatus as in claim 2 wherein the spring tabs project away from the ground spring hole.

4. An apparatus as in claim 2 wherein the spring tabs curl toward the ground spring hole.

5. An apparatus as in claim 1 wherein the dielectric substrate has a top surface, wherein the ground conductor is attached to the top surface, the apparatus further comprising a waveguide as follows:

a strip signal conductor attached to the top surface and coplanar with the ground conductor; and wherein the ground conductor is separated from the strip signal conductor by a substantially uniform space, thereby forming a substantially uniform transmission line impedance between the strip signal conductor and the ground conductor.

6. An apparatus as in claim 5 wherein the spring tabs project away from the ground spring hole.

7. An apparatus as in claim 5 wherein the spring tabs curl toward the ground spring hole.

* * * * *